United States Patent
Braceras et al.

(10) Patent No.: US 6,327,224 B1
(45) Date of Patent: Dec. 4, 2001

(54) ON-CHIP METHOD FOR MEASURING ACCESS TIME AND DATA-PIN SPREAD

(75) Inventors: Geordie Maria Braceras, Essex Junction; Harold Pilo, Underhill; Dale E. Pontius, Colchester, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/595,632

(22) Filed: Jun. 16, 2000

(51) Int. Cl.[7] .............................. G04F 10/00; G04F 8/00; G11C 29/00
(52) U.S. Cl. ........................ 368/113; 368/118; 714/718
(58) Field of Search ........................ 368/113, 118–120; 324/73 R, 73 AT; 714/718, 719

(56) References Cited

U.S. PATENT DOCUMENTS

| | | |
|---|---|---|
| 4,878,209 | 10/1989 | Bassett et al. |
| 5,083,299 * | 1/1992 | Schwanke et al. ............... 368/113 |
| 5,181,191 * | 1/1993 | Farwell ............................. 368/113 |
| 5,268,639 * | 12/1993 | Gassarro et al. ................ 324/158 R |
| 6,243,840 * | 6/2001 | Raad et al. ...................... 714/719 |

FOREIGN PATENT DOCUMENTS 2-184048   7/1990   (JP) .

OTHER PUBLICATIONS

Abstract of Japanese Patent Application No. 09–171053, dated Jun. 30, 1997.

G.M. Belansek, et al., "Self–Timed Performance Test For Stand–Alone Random–Access Memories", IBM Technical Disclosure Bulletin, vol. 30, No. 5, Oct. 1987.

O. Bula, et al., "Internal Access Time Measurements For Random–Access Memory Circuits", IBM Technical Disclosure Bulletin, vol. 31, No. 7, Dec. 1988.

* cited by examiner

Primary Examiner—Vit Miska
(74) Attorney, Agent, or Firm—Scully, Scott, Murphy & Presser; Margaret A. Pepper

(57) ABSTRACT

An on-chip I/O timings measurement circuit that improves measurement accuracy compared to conventional external test methods. This circuit guarantees AC timing specifications that are too small for the measurement capabilities of today's high-frequency memory testers. This system in incorporated into the SRAM via the JTAG interface and a JTAG private instruction. A private instruction refers to an unused instruction from the industry-standard public instruction set. Private instructions are usually reserved for the manufacturer, but may be provided to the user as an enhancement to the standard JTAG instruction set.

12 Claims, 3 Drawing Sheets

Table 1: JTAG SRAM-Instruction Set

| CODE | INSTRUCTION | DESCRIPTION |
|---|---|---|
| 000 | SAMPLE-Z | Boundary scan placed between TDI and TDO |
| 001 | IDCODE | ID register placed between TDI and TDO |
| 010 | SAMPLE-Z | Boundary scan placed between TDI and TDO |
| 011 | PRIVATE (PINST1, PINST2) | Activates on-chip access measurement system |
| 100 | SAMPLE | Boundary scan placed between TDI and TDO |
| 101 | PRIVATE | Other private instruction |
| 110 | PRIVATE | Other private instruction |
| 111 | BYPASS | Bypass register placed between TDI and TDO |

Fig. 1

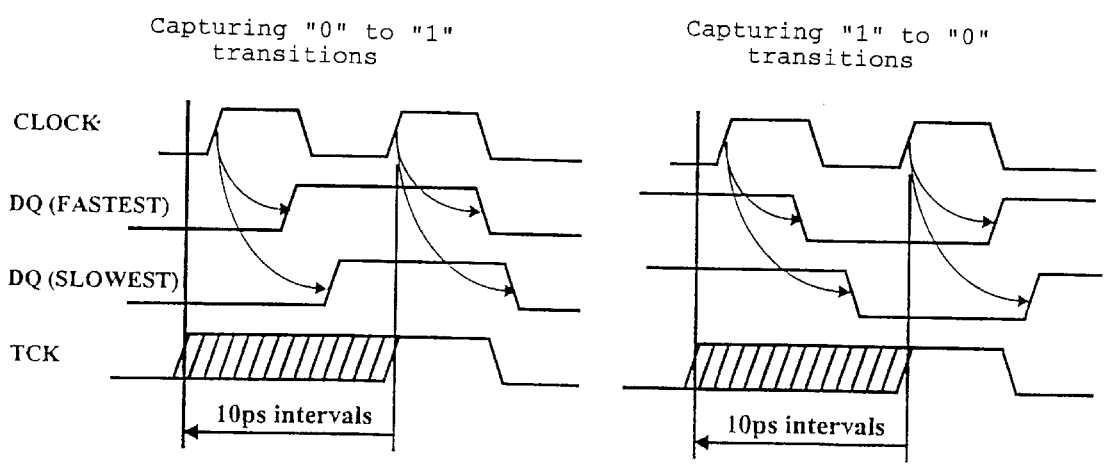

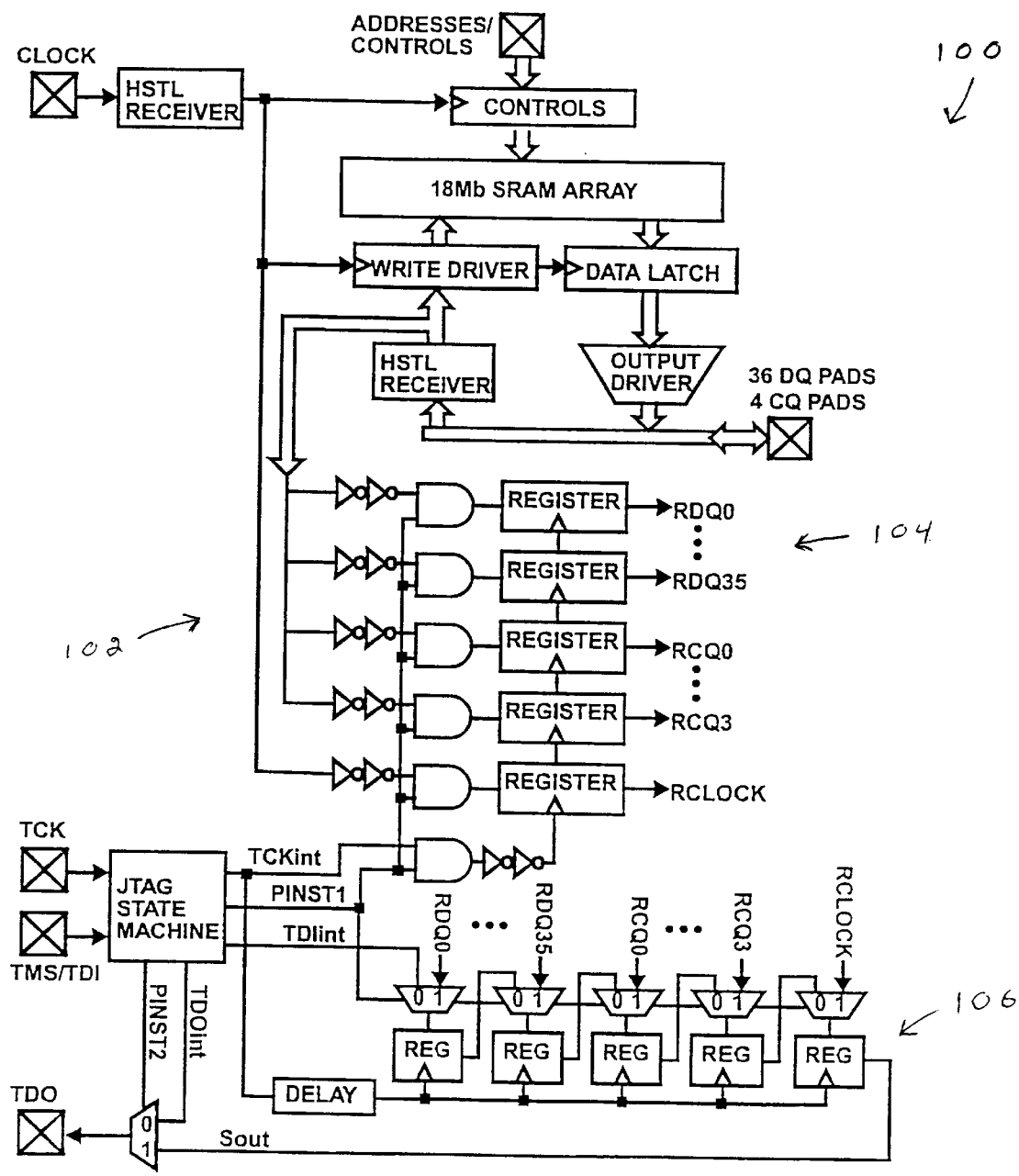
Figure 4. On-chip I/O timings measurement circuit.

Table 2: On-chip access measurement test flow

| 1 | Load JTAG private instruction PINST1 to activate sampling of Clock, DQs and CQs |
|---|---|
| 2 | Run checkerboard-read0-read1 pattern |
| 3 | TCK rising edge is placed at a time = "start" in the cycle where the worst-case (tester-measured) '0' to '1' transitions occur |
| 4 | Select private instruction PINST2 and deselect PINST1 |
| 5 | Pulse TCK to scan-out registered values of DQs, CQs or Clock |
| 6 | Repeat steps 1-5 with TCK swept toward Clock in 10ps intervals |
| 7 | The timing difference of TCK from the first transition of a DQ-scan-register bit to the transition of the Clock bit results in the '0' to '1' access time |

Fig. 5

ON-CHIP METHOD FOR MEASURING ACCESS TIME AND DATA-PIN SPREAD

BACKGROUND OF THE INVENTION

This invention generally relates to measuring timing characteristics of SRAM chips; and more specifically, the invention relates to timing measurements of data-pins spread and access times for such chips.

Traditionally, at-speed component test has guaranteed all AC timing specifications for SRAMs. The performance of high-speed SRAMs is presently limited, however, by tester accuracy in the measurement of input/output (I/O) timings. Specifically, access-time measurements, I/O pin-to-pin skew measurements, and echo-clock-to-data tracking measurements may only be externally determined to an accuracy of +/−200 ps or more. This external limitation can result in high-performance components becoming unnecessarily downgraded to lower performance applications. This downgrading results in a substantial reduction in high-performance applications and in a substantial reduction in high-performance product yield. In addition, the need for ever-increasing tester accuracy causes high test-equipment and manufacturing test costs.

For example, a device being tested for an access time of 1.5 ns will be subject to two external test constraints. First, the tester guardband is subtracted from the access-time strobe. For a typical high-speed tester, this guardband is 200 ps. Second, the access-time measurement is referenced to the worst-case (i.e., slowest) I/O of the chip. A 200 ps tester-induced pin-to-pin I/O spread results in an additional access time penalty because the access strobe must capture the slowest pin of the spread. In contrast to this wide spread induced by the tester, the pin-to-pin spread intrinsic to the SRAM can be as narrow as 30 ps for a well-matched design. A combined tester-imposed penalty of 300 ps from these two constraints requires that a device have an intrinsic access time of approximately 1.2 ns to meet a 1.5 ns specification at test. The same constraints apply for measurements of echo-clock to data tracking.

SUMMARY OF THE INVENTION

An object of this invention is to improve methods for measuring timing characteristics of SRAM chips.

Another object of this invention is to provide an on-chip method for measuring access time and data-pins spread of SRAMs.

These and other objectives are attained with a method and system for timing characteristics of an SRAM chip. The method comprises the steps of loading instructions onto the chip to activate sampling of data output, and detecting data output transitions. The method further comprises the steps of providing the chip with a test clock having a given state transition, and sweeping the test clock across detected data output transitions to identify timing characteristics of the circuit. Preferably this test clock is the JTAG clock.

The present invention may be used to measure either, or both, the data pins spread or access time of an SRAM. To do this, sweeping of the test pattern continues from the slowest data output transition detection to the fastest data output transition detection and proceeds until a given transition is detected on the SRAM clock. The difference in timing from the sampling of the slowest data output transition to the sampling of the fastest data output transition yields the data output pin-to-pin spread. The difference in timing from the sampling of the slowest data output transition to the sampling of the transition of the SRAM clock yields the access time.

Guaranteeing critical AC timing specifications by design-assisted test, in accordance with the present invention, overcomes external tester measurement accuracy limitations. Design-assisted test is desirable because on-chip measurement circuitry provides an improvement in measurement accuracy over conventional external test methods. The preferred embodiments of the on-chip circuit techniques herein described measure SRAM access time with an accuracy of +/−30 ps and compare I/O-data to echo-clock timings with an accuracy of +/−10 ps.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIG. 1 is a table showing an SRAM instruction set.

FIGS. 2 and 3 illustrate the manner in which a test clock is swept across data transitions.

FIG. 4 is a diagram of an on-chip I/O timings measurement circuit embodying the present invention.

FIG. 5 is a table outlining an on-chip access measurement test embodying the present invention.

DETAILED DESCRIPTION OF THE PREFERRED EMBODIMENTS

The present invention, generally, relates to an on-chip I/O timing circuit that improves measurement accuracy compared to conventional external test methods. This circuit may be used to guarantee AC timing specifications that are too small for the measurement capabilities of today's high-frequency memory testers. The system is incorporated into an SRAM via the JTAG interface and a JTAG private instruction. A private instruction refers to an unused instruction from the industry-standard public instruction set. Private instructions are usually reserved for the manufacturer, but may be provided to the user as an enhancement to the standard JTAG instruction set. Table 1 of FIG. 1 shows the JTAG SRAM instruction set implemented by most SRAM manufacturers. Private instruction 011 activates the on-chip access measurement system. the JTAG private instruction PINST1 activates the I/O-timing measurement circuit. The JTAG clock (TCK) is then swept across one entire SRAM cycle at the minimum possible tester increment (10 ps or less). TCK captures the transitions of data output (DQ), chip-clock, and echo-clock (CQ) pins for each cycle. The waveform diagram in FIG. 2 shows the sweeping of TCK across '0' to '1' DQ transitions and the corresponding '0' to '1' SRAM clock transition that generates the DQ access time. FIGS. 2 and 3 illustrate only the fastest and slowest DQs out of a group of 36. Because the SRAM access time can be pattern-dependent, the patterns that result in the slowest access time, widest DQ spread, and greatest DQ-CQ skew must be used for each respective measurement. These patterns may be determined empirically through extensive use of the I/O-timing measurement circuit during product characterization.

To measure access time and DQ spread, the rising edge of TCK is incrementally swept to the left in 10 ps time steps. The first TCK edge must occur at a time when the transition of all DQs from '0' to '1' has occurred. The sweeping continues from the slowest DQ detection to the fastest DQ detection and proceeds until a '0' to '1' transition is detected on the SRAM clock. The difference in TCK timing from the sampling of the first DQ (slowest) to the sampling of the last DQ (fastest) yields the DQ pin-to-pin spread. The difference in TCK timing from the sampling of the first DQ (slowest) to the sampling of the clock's '0' to '1' transition yields the access time. The waveform diagram of FIG. 3 shows the sweeping of '1' to '0' transitions by TCK.

FIG. 4 shows the on-chip I/O timings measurement circuit 100. The chip clock, DQ, and CQ inputs are amplified by identical HSTL receivers and connected to the test circuitry through two small buffering stages 102. These buffers 102 are designed to minimize loading of the receiver circuitry resulting from the test circuitry. Minimizing this load is advantageous because the test circuitry is connected in parallel with the regular input path. The test buffers drive to registers 104 that are sampled by an internal TCK signal (TCKint) upon activation of the private instruction PINST1. The register clock network is designed to minimize the by-design skew of the clock to all 41 registers. This is accomplished with a maximum clock skew of 5 ps.

After any given TCK sampling of the DQs, CQs or Clock occurs, the registered values (ex., RDQ0) are loaded into scan registers (REG) 106 by a delayed version of TCKint. PINST1 is then deselected and PINST2 is selected to serially shift out the registered values. The JTAG output pin, TDO, is monitored to determine the value of the registers. Table 2 of FIG. 5 shows an example of the test flow that measures a worst-case '0' to '1' access time. This test flow may be repeated to measure a '1' to '0' access time, DQ pin-to-in spread and CQ-to-DQ tracking skew.

While it is apparent that the invention herein disclosed is well calculated to fulfill the objects stated above, it will be appreciated that numerous modifications and embodiments may be devised by those skilled in the art, and it is intended that the appended claims cover all modifications and embodiments as fall within the true spirit and scope of the present invention.

What is claimed is:

1. A method of measuring a timing characteristic of an SRAM chip, comprising the steps:

loading instructions onto the SRAM to activate sampling of data output;

detecting data output transitions;

providing the chip with a test clock having a given state transition; and sweeping the test clock across detected data output transitions to identify timing characteristics of the SRAM.

2. A method according to claim 1, wherein the timing characteristic is a data-pins spread of the SRAM.

3. A method according to claim 1, wherein:

the data output transitions includes a slowest transition and a fastest transition; and the sweeping step includes the step of sweeping the test clock across the slowest and fastest transitions to determine a data-pins spread of the SRAM.

4. A method according to claim 1, wherein the timing characteristic is an access time of the SRAM.

5. A method according to claim 1, wherein:

the SRAM includes an internal clock having state changes;

the data output transitions includes a slowest transition; and the sweeping step includes the step of sweeping the test clock from the slowest transition to a state change of the internal clock to determine an access time of the integrated circuit.

6. A method according to claim 1, further including the step of registering data output transitions, and wherein the detecting step includes the step of detecting the data output transitions as they are being registered.

7. An SRAM chip having an on-chip circuit for measuring a timing characteristic of the chip, said on-chip measuring circuit comprising:

means for receiving instructions loaded onto the SRAM to activate sampling of data output;

means for detecting data output transitions;

means for receiving a test clock provided on the SRAM and having a given state transition; and means for sweeping the test clock across detected data output transitions to identify timing characteristics of the SRAM.

8. An SRAM chip according to claim 7, wherein the timing characteristic is a data-pins spread of the SRAM.

9. An SRAM chip according to claim 7, wherein:

the data output transitions includes a slowest transition and a fastest transition; and the sweeping means includes means for sweeping the test clock across the slowest and fastest transitions to determine a data-pins spread of the SRAM.

10. An SRAM according to claim 7, wherein the timing characteristic is an access time of the SRAM.

11. An SRAM according to claim 7, wherein:

the SRAM includes an internal clock having state changes;

the data output transitions includes a slowest transition; and the sweeping means includes means for sweeping the test clock from the slowest transition to a state change of the internal clock to determine an access time of the integrated circuit.

12. An SRAM according to claim 7, further including means for registering data output transitions, and wherein the detecting means includes means for detecting the data output transitions as they are being registered.

* * * * *